US011601753B2

(12) United States Patent
Chiu et al.

(10) Patent No.: US 11,601,753 B2
(45) Date of Patent: Mar. 7, 2023

(54) METHOD FOR EQUALIZING INPUT SIGNAL TO GENERATE EQUALIZER OUTPUT SIGNAL AND ASSOCIATED PARAMETRIC EQUALIZER

(71) Applicant: Elite Semiconductor Microelectronics Technology Inc., Hsinchu (TW)

(72) Inventors: Hsin-Yuan Chiu, Hsinchu (TW); Tsung-Fu Lin, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 167 days.

(21) Appl. No.: 17/344,907

(22) Filed: Jun. 10, 2021

(65) Prior Publication Data

US 2022/0400341 A1    Dec. 15, 2022

(51) Int. Cl.
*H04R 3/14* (2006.01)
*H03G 5/00* (2006.01)
*H04R 3/04* (2006.01)
*H03G 5/02* (2006.01)
*H03G 5/16* (2006.01)

(52) U.S. Cl.
CPC .............. *H04R 3/04* (2013.01); *H03G 5/005* (2013.01); *H03G 5/025* (2013.01); *H03G 5/165* (2013.01)

(58) Field of Classification Search
CPC ............. H03G 5/00; H03G 5/025; H04R 3/14
USPC ............................................ 381/98, 99, 103
See application file for complete search history.

(56) References Cited

U.S. PATENT DOCUMENTS

2014/0219475 A1*   8/2014   Chen ...................... H03G 5/165
                                                              381/103

* cited by examiner

*Primary Examiner* — George C Monikang
(74) *Attorney, Agent, or Firm* — Winston Hsu

(57) ABSTRACT

A parametric equalizer includes an equalizer circuit, a first protection circuit, a second protection circuit, and a first addition circuit. The equalizer circuit is arranged to receive an input signal, and process the input signal to generate an output signal. The first protection circuit is arranged to generate a first protection signal according to the output signal, the input signal, and a first processed signal. The second protection circuit is arranged to generate a second protection signal according to the input signal and a second processed signal. The first addition circuit is coupled to the first protection circuit and the second protection circuit, and is arranged to combine the first protection signal and the second protection signal to generate an equalizer output signal.

18 Claims, 8 Drawing Sheets

METHOD FOR EQUALIZING INPUT SIGNAL TO GENERATE EQUALIZER OUTPUT SIGNAL AND ASSOCIATED PARAMETRIC EQUALIZER

BACKGROUND OF THE INVENTION

1. Field of the Invention

The present invention is related to frequency response compensation, and more particularly, to a method for equalizing an input signal to generate an equalizer output signal and associated parametric equalizer.

2. Description of the Prior Art

Parametric equalizer is an equalizer that may configure parameters such as a center frequency and a quality factor (Q), to perform an output frequency response modulation on an input signal. By using the parametric equalizer, when the level of the signal inputted to the parametric equalizer is too large, clipping of the signal may not occur. However, when the level of the signal inputted to the parametric equalizer is too small, good auditory effect may not be achieved by using the parametric equalizer with the fixed gain attenuation. As a result, for addressing the above-mentioned problems, a method for compensating the output frequency response regarding the level of the input signal and an associated parametric equalizer are urgently needed.

SUMMARY OF THE INVENTION

It is therefore an objective of the present invention to provide a method for equalizing an input signal to generate an equalizer output signal and associated parametric equalizer, in order to solve the above-mentioned problems.

According to an embodiment of the present invention, a parametric equalizer is provided. The parametric equalizer may include an equalizer circuit, a first protection circuit, a second protection circuit, and a first addition circuit. The equalizer circuit may be arranged to receive an input signal, and process the input signal to generate an output signal. The first protection circuit may be arranged to generate a first protection signal according to the output signal, the input signal, and a first processed signal, wherein a peak level of the first protection signal is protected from exceeding a first threshold value employed by the first protection circuit. The second protection circuit may be arranged to generate a second protection signal according to the input signal and a second processed signal, wherein the first processed signal is involved in generation of the second protection signal, the second processed signal is involved in generation of the first protection signal, and a peak level of the first processed signal is protected from exceeding a second threshold value employed by the second protection circuit. The first addition circuit may be coupled to the first protection circuit and the second protection circuit, and may be arranged to combine the first protection signal and the second protection signal to generate an equalizer output signal.

According to an embodiment of the present invention, a method for equalizing an input signal to generate an equalizer output signal is provided. The method may include: receiving the input signal, and processing the input signal to generate an output signal; generating a first protection signal according to the output signal, the input signal, and a first processed signal, wherein a peak level of the first protection signal is protected from exceeding a first threshold value; generating a second protection signal according to the input signal and a second processed signal, wherein the first processed signal is involved in generation of the second protection signal, the second processed signal is involved in generation of the first protection signal, and a peak level of the first processed signal is protected from exceeding a second threshold value; and combining the first protection signal and the second protection signal to generate the equalizer output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
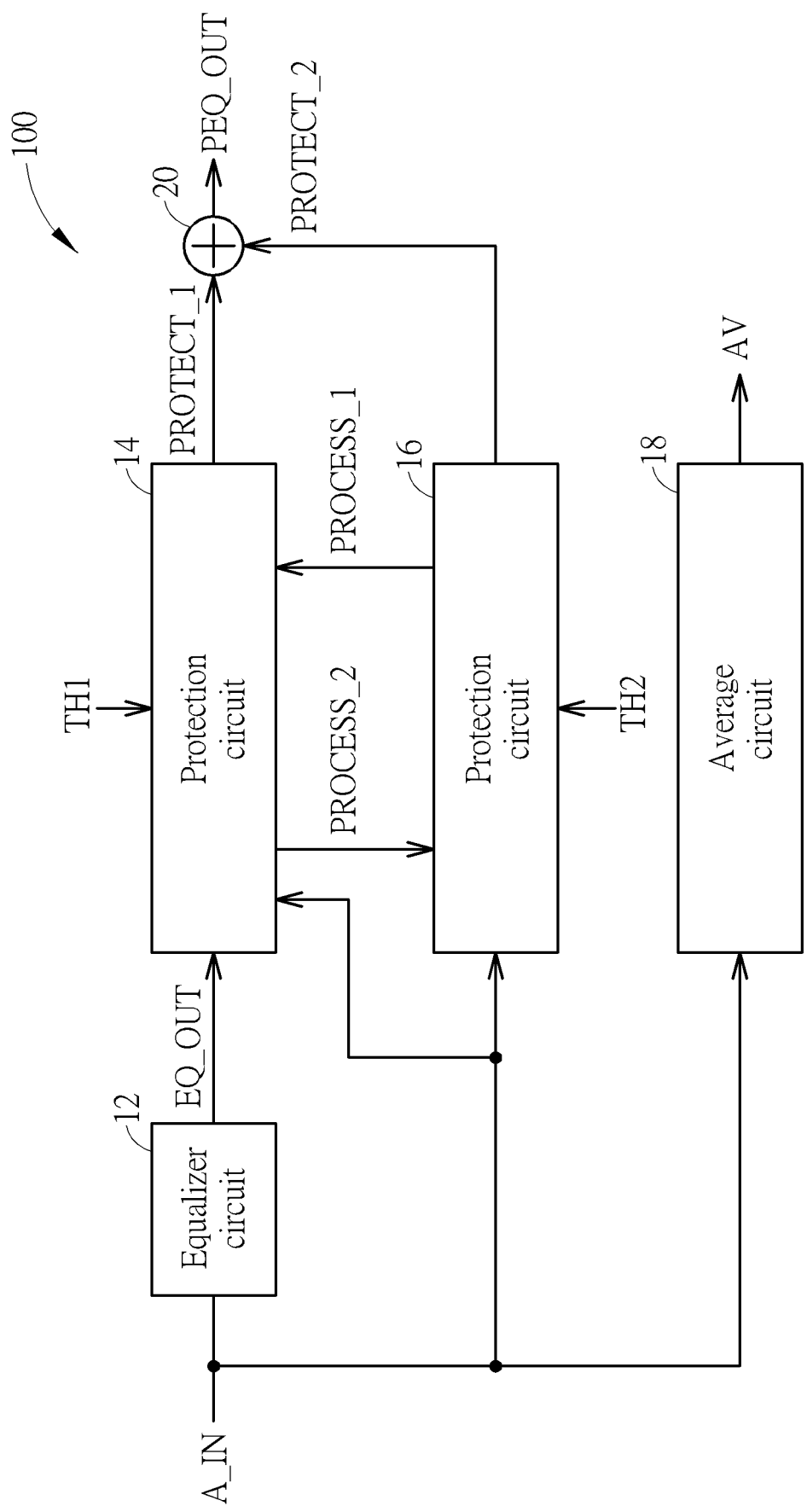
FIG. 1 is a block diagram illustrating a parametric equalizer according to an embodiment of the present invention.

FIG. 1 is a block diagram illustrating a parametric equalizer 100 according to an embodiment of the present invention. The parametric equalizer 100 can receive an input signal A_IN such as an audio signal, and equalize the input signal A_IN to generate an equalizer output signal PEQ_OUT. As shown in FIG. 1, the parametric equalizer 100 can include an equalizer circuit 12, a plurality of protection circuits 14 and 16, an average circuit 18, and an addition circuit 20. The equalizer circuit 12 can be arranged to receive the input signal A_IN, and process the input signal A_IN to generate an output signal EQ_OUT. The protection circuit 14 can be arranged to generate a first protection signal PROTECT_1 according to the output signal EQ_OUT, the input signal A_IN, and a first processed signal PROCESS_1, wherein a peak level of the first protection signal PROTECT_1 is protected from exceeding a first threshold value TH1 employed by the protection circuit 14. For example, the first threshold value TH1 may be a user-programmable parameter. The protection circuit 16 can be arranged to generate a second protection signal PROTECT_2 according to the input signal A_IN and a second processed signal PROCESS_2, wherein the first processed signal PROCESS_1 is involved in generation of the second protection signal PROTECT_2, the second processed signal PROCESS_2 is involved in generation of the first protection signal PROTECT_1, and a peak level of the first processed signal PROCESS_1 is protected from exceeding a second threshold value TH2 employed by the protection circuit 16. The average circuit 18 can be arranged to generate an average value AV of the input signal A_IN as the second threshold value TH2 (i.e. TH2=AV). For example, the average value AV may be a root-mean-square (RMS) value of the input signal A_IN. That is, the second threshold value TH2 is equal to the RMS value of the input signal A_IN, but the present invention is not limited thereto. The addition circuit 20 can be coupled to the protection circuit 14 and the protection circuit 16, and can be arranged to combine the first protection signal PROTECT_1 and the second protection signal PROTECT_2 to generate the equalizer output signal PEQ_OUT (i.e. PEQ_OUT=PROTECT_1+PROTECT_2).

Figure 2:
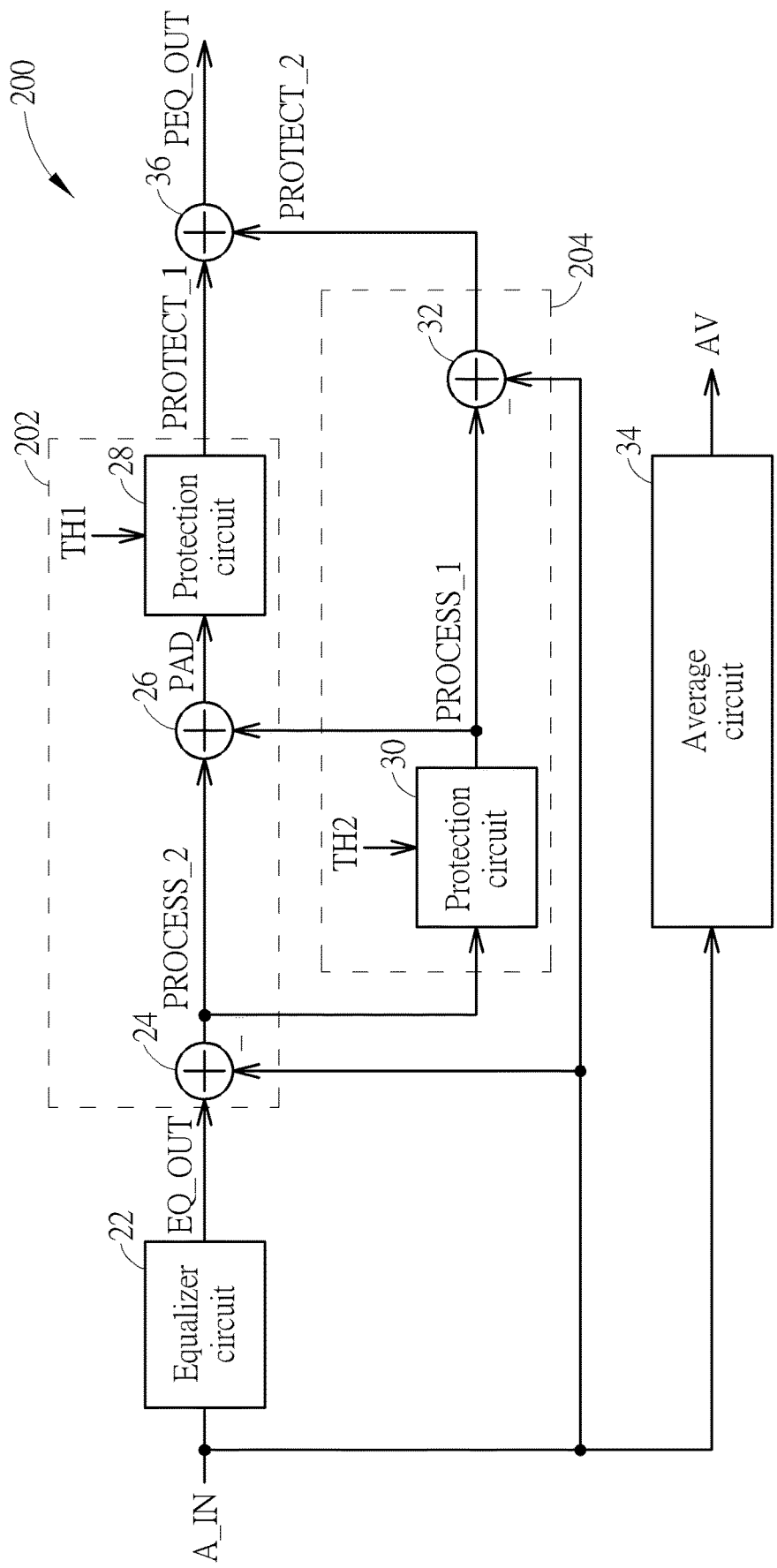
FIG. 2 is a diagram illustrating an embodiment of the parametric equalizer shown in FIG. 1.

The parametric equalizer 100 is capable of dynamically adjusting the equalization applied to the input signal A_IN according to a level of the input signal A_IN. FIG. 2 is a diagram illustrating an embodiment of the parametric equalizer 100 shown in FIG. 1. The parametric equalizer 100 shown in FIG. 1 can be implemented by a parametric equalizer 200 shown in FIG. 2 (i.e. the parametric equalizer 200 also adopts the architecture of the parametric equalizer 100 shown in FIG. 1). The parametric equalizer 200 can include an equalizer circuit 22, a plurality of protection circuits 202 and 204 (e.g. the plurality of protection circuits 14 and 16 can be implemented by the plurality of protection circuits 202 and 204), an average circuit 34, and an addition circuit 36. The equalizer circuit 22 can be arranged to receive the input signal A_IN, and process the input signal A_IN to generate the output signal EQ_OUT.

In this embodiment, the protection circuit 202 can include a subtraction circuit 24, an addition circuit 26, and an automatic gain control (for brevity, labeled as "AGC") circuit 28. The subtraction circuit 24 can be coupled to the equalizer circuit 22, and can be arranged to receive the input signal A_IN, and subtract the input signal A_IN from the output signal EQ_OUT to generate the second processed signal PROCESS_2 (i.e. PROCESS_2=EQ_OUT−A_IN). The addition circuit 26 can be coupled to the subtraction circuit 24 and the protection circuit 204, and can be arranged to combine the first processed signal PROCESS_1 and the second processed signal PROCESS_2 to generate a pre-adjusted signal PAD (i.e. PAD=PROCESS_1+PROCESS_2). The AGC circuit 28 can be coupled to the addition circuit 26, and can be arranged to generate the first protection signal PROTECT_1 according to the pre-adjusted signal PAD and the first threshold value TH1, wherein a peak level of the first protection signal PROTECT_1 is protected from exceeding the first threshold value TH1 employed by the AGC circuit 28.

The protection circuit 204 can include an AGC circuit 30 and a subtraction circuit 32. The AGC circuit 30 can be coupled to the subtraction circuit 24 and the addition circuit 26, and can be arranged to generate the first processed signal PROCESS_1 according to the second processed signal PROCESS_2 and the second threshold value TH2, wherein a peak level of the first processed signal PROCESS_1 is protected from exceeding the second threshold value TH2 employed by the AGC circuit 30. The subtraction circuit 32 can be coupled to the AGC circuit 30, and can be arranged to subtract the first processed signal PROCESS_1 from the input signal A_IN to generate the second protection signal PROTECT_2 (i.e. PROTECT_2=A_IN−PROCESS_1). The average circuit 34 can be arranged to generate the average value AV of the input signal A_IN as the second threshold value TH2, wherein the average value AV may be the RMS value of the input signal A_IN (i.e. the second threshold value TH2 is equal to the RMS value of the input signal A_IN, but the present invention is not limited thereto). The addition circuit 36 can be coupled to the protection circuit 202 and the protection circuit 204, and can be arranged to combine the first protection signal PROTECT_1 and the second protection signal PROTECT_2 to generate the equalizer output signal PEQ_OUT.

According to an input level of the input signal A_IN, a peak level of the output signal EQ_OUT, and the first threshold value TH1, the process of equalizing the input signal A_IN to generate the equalizer output signal PEQ_OUT in the present invention can be divided into 3 cases (e.g. case 1, case 2, and case 3).

Figure 3:
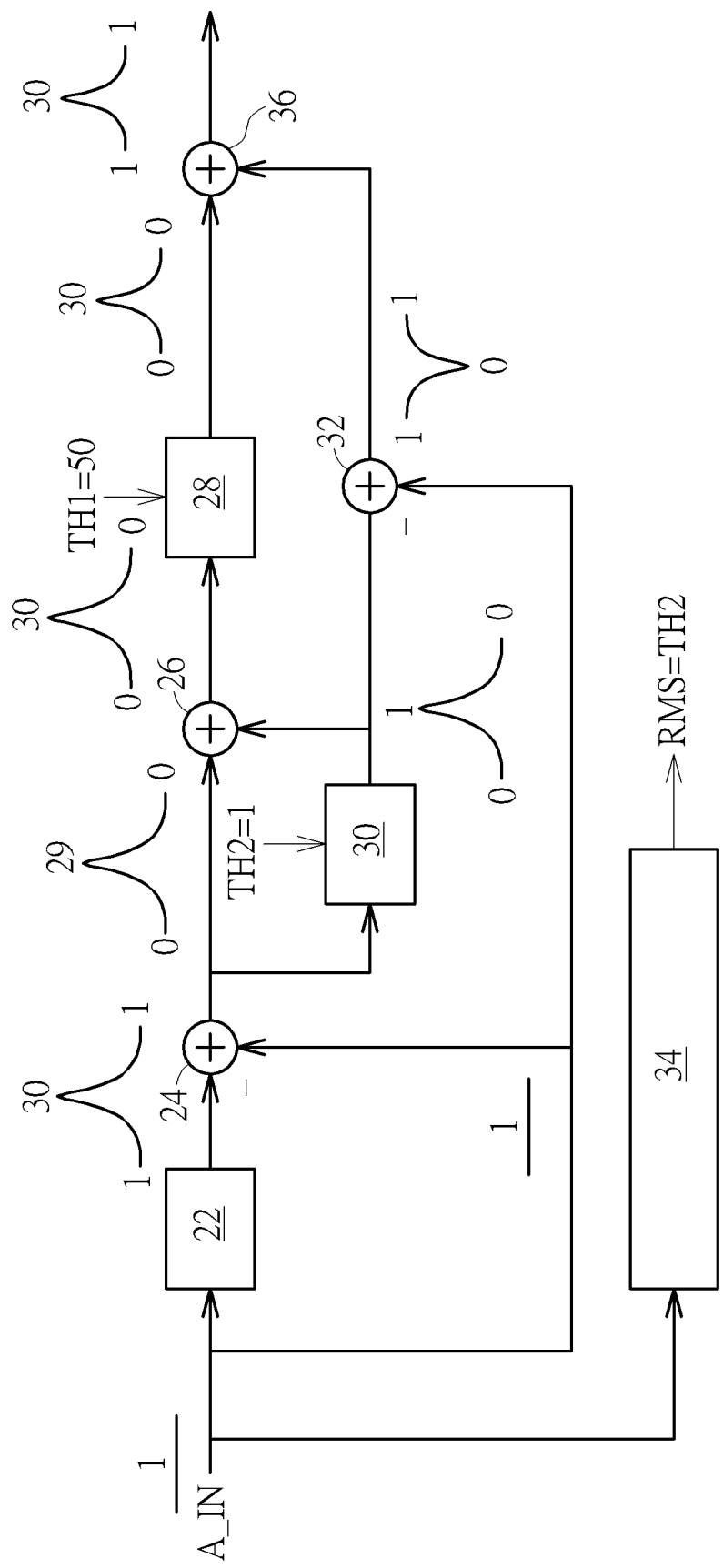
FIG. 3 is a diagram illustrating operations of the parametric equalizer shown in FIG. 2 that operates under case 1 according to an embodiment of the present invention.

Please refer to FIG. 2 in conjunction with FIG. 3. FIG. 3 is a diagram illustrating operations of the parametric equalizer 200 under case 1 according to an embodiment of the present invention. In case 1, both of the input level of the input signal A_IN and the peak level of the output signal EQ_OUT are smaller than or equal to the first threshold value TH1. For example, the input level of the input signal A_IN is 1, a peak gain of the equalizer circuit 22 is 30 (i.e. the peak level of the output signal EQ_OUT is 30), and the first threshold value TH1 is set as 50. The purpose of the AGC circuit 28 is to protect the peak level of the first protection signal PROTECT_1 from exceeding the first threshold value TH1, and the peak level of the pre-adjusted signal PAD is equal to the peak level of the output signal EQ_OUT (e.g. the peak level of the pre-adjusted signal PAD is equal to 30). Since the peak level of the pre-adjusted signal PAD does not exceed the first threshold value TH1, there is no need to clamp the peak level of the first protection signal PROTECT_1 when the pre-adjusted signal PAD passes through the AGC circuit 28, such that the peak level of the first protection signal PROTECT_1 and the peak level of the equalizer output signal PEQ_OUT are both identical to the peak level of the pre-adjusted signal PAD (e.g. the peak level of the first protection signal PROTECT_1 and the peak level the equalizer output signal PEQ_OUT are both identical to 30). In addition, the peak level of the first protection signal PROTECT_1 is greater than the input level of the input signal A_IN. By combining the first protection signal PROTECT_1 and the second protection signal PROTECT_2 through the addition circuit 36, a minimum level of the equalizer output signal PEQ_OUT is equal to the input level of the input signal A_IN (e.g. the minimum level of the equalizer output signal PEQ_OUT is equal to 1). For case 1, the parametric equalizer 200 acts as a peaking filter that provides a boost in the vicinity of the center frequency without level clamping, and has a unity gain far away from the center frequency.

Figure 4:
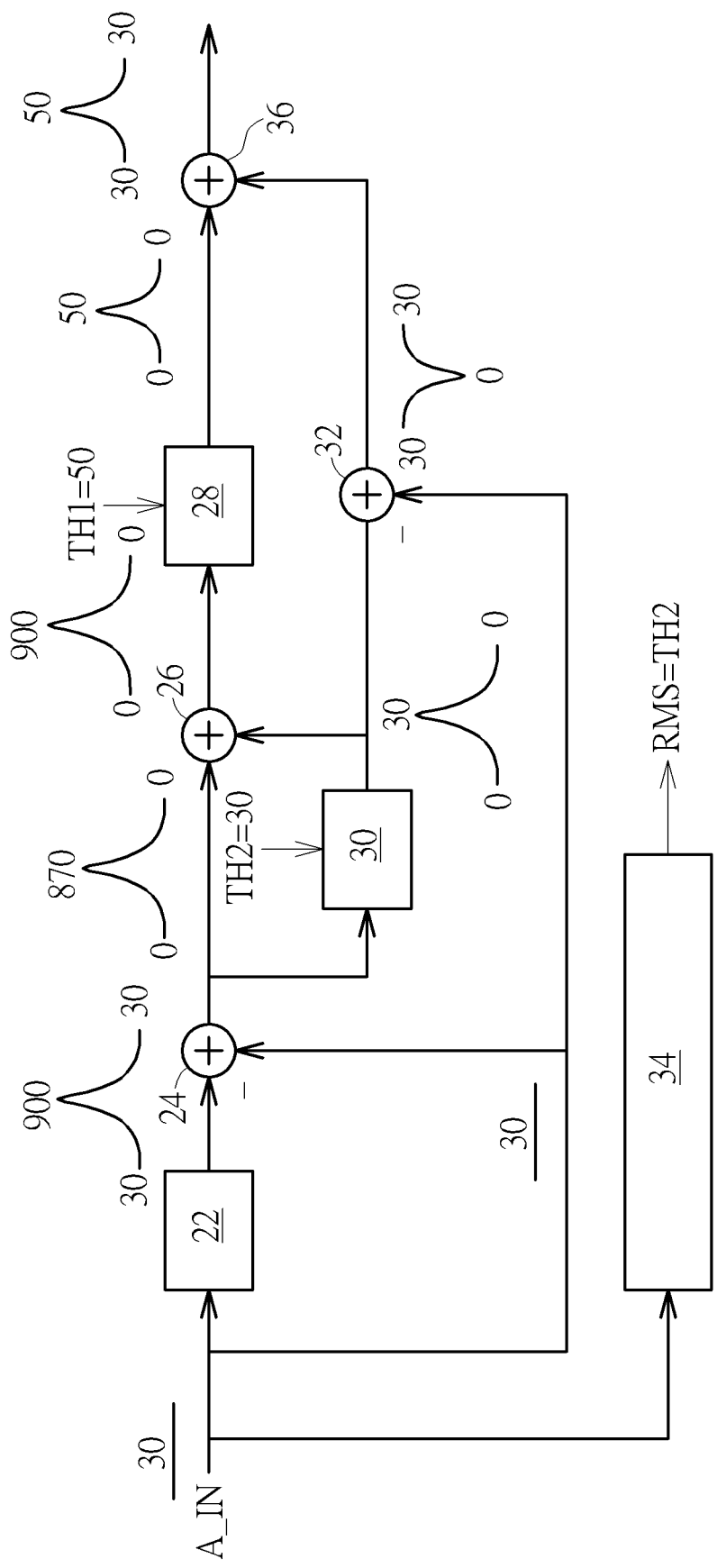
FIG. 4 is a diagram illustrating operations of the parametric equalizer shown in FIG. 2 that operates under case 2 according to an embodiment of the present invention.

Please refer to FIG. 2 in conjunction with FIG. 4. FIG. 4 is a diagram illustrating operations of the parametric equalizer 200 under case 2 according to an embodiment of the present invention. In case 2, the input level of the input signal A_IN is smaller than or equal to the first threshold value TH1, and the peak level of the output signal EQ_OUT is greater than the first threshold value TH1. For example, the input level of the input signal A_IN is 30, a peak gain of the equalizer circuit 22 is 30 (i.e. the peak level of the output signal EQ_OUT is 900), and the first threshold value TH1 is set as 50. The peak level of the pre-adjusted signal PAD is equal to the peak level of the output signal EQ_OUT (e.g. the peak level of the pre-adjusted signal PAD is equal to 900). The purpose of the AGC circuit 28 is to protect the peak level of the first protection signal PROTECT_1 from exceeding the first threshold value TH1. Since the peak level of the pre-adjusted signal PAD exceeds the first threshold value TH1, the peak level of the first protection signal PROTECT_1 is limited at the first threshold value TH1 (e.g. the peak level of the first protection signal PROTECT_1 is limited at 50) when the pre-adjusted signal PAD passes through the AGC circuit 28, such that the peak level of the equalizer output signal PEQ_OUT is equal to the peak level of the first protection signal PROTECT_1 (i.e. the peak level of the equalizer output signal PEQ_OUT is equal to 50). In addition, the clamped peak level of the first protection signal PROTECT_1 is greater than the input level of the input signal A_IN. Hence, by combining the first protection signal PROTECT_1 and the second protection signal PROTECT_2 through the addition circuit 36, a minimum level of the equalizer output signal PEQ_OUT is equal to the input level of the input signal A_IN (e.g. the minimum level of the equalizer output signal PEQ_OUT is equal to 30). For case 2, the parametric equalizer 200 acts as a peaking filter that provides a boost in the vicinity of the center frequency with level clamping, and has a unity gain far away from the center frequency.

Figure 5:
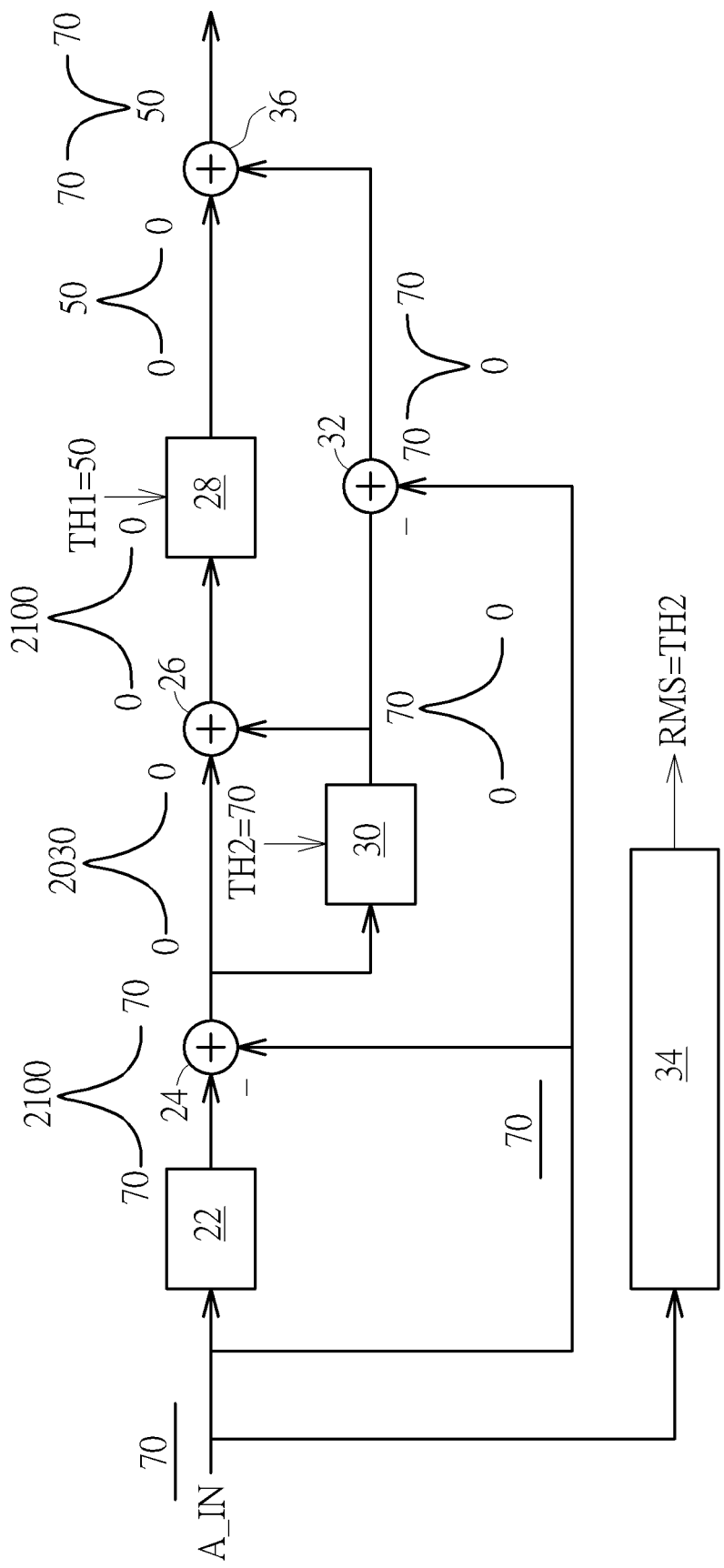
FIG. 5 is a diagram illustrating operations of the parametric equalizer shown in FIG. 2 that operates under case 3 according to an embodiment of the present invention.

Please refer to FIG. 2 in conjunction with FIG. 5. FIG. 5 is a diagram illustrating operations of the parametric equalizer 200 under case 3 according to an embodiment of the present invention. In case 3, both of the input level of the input signal A_IN and the peak level of the output signal EQ_OUT are greater than the first threshold value TH1. For example, the input level of the input signal A_IN is 70, a peak gain of the equalizer circuit 22 is 30 (i.e. the peak level of the output signal EQ_OUT is 2100), and the first threshold value TH1 is set as 50. The peak level of the pre-adjusted signal PAD is equal to the peak level of the output signal EQ_OUT (e.g. the peak level of the pre-adjusted signal PAD is equal to 2100). The purpose of the AGC circuit 28 is to protect the peak level of the first protection signal PROTECT_1 from exceeding the first threshold value TH1. Since the peak level of the pre-adjusted signal PAD exceeds the first threshold value TH1, the peak level of the first protection signal PROTECT_1 is limited at the first threshold value TH1 (e.g. the peak level of the first protection signal PROTECT_1 is limited at 50) when the pre-adjusted signal PAD passes through the AGC circuit 28. In addition, the clamped peak level of the first protection signal PROTECT_1 is smaller than the input level of the input signal A_IN. Hence, by combining the first protection signal PROTECT_1 and the second protection signal PROTECT_2 through the addition circuit 36, a maximum level of the equalizer output signal PEQ_OUT is equal to the input level of the input signal A_IN (e.g. the maximum level of the equalizer output signal PEQ_OUT is equal to 70), and a minimum level of the equalizer output signal PEQ_OUT is equal to the peak level of the first protection signal PROTECT_1 (e.g. the valley level of the equalizer output signal PEQ_OUT is equal to 50). For case 3, the parametric equalizer 200 acts as a notch filter that provides suppression in the vicinity of the center frequency with level clamping, and has a unity gain far away from the center frequency.

Figure 6:
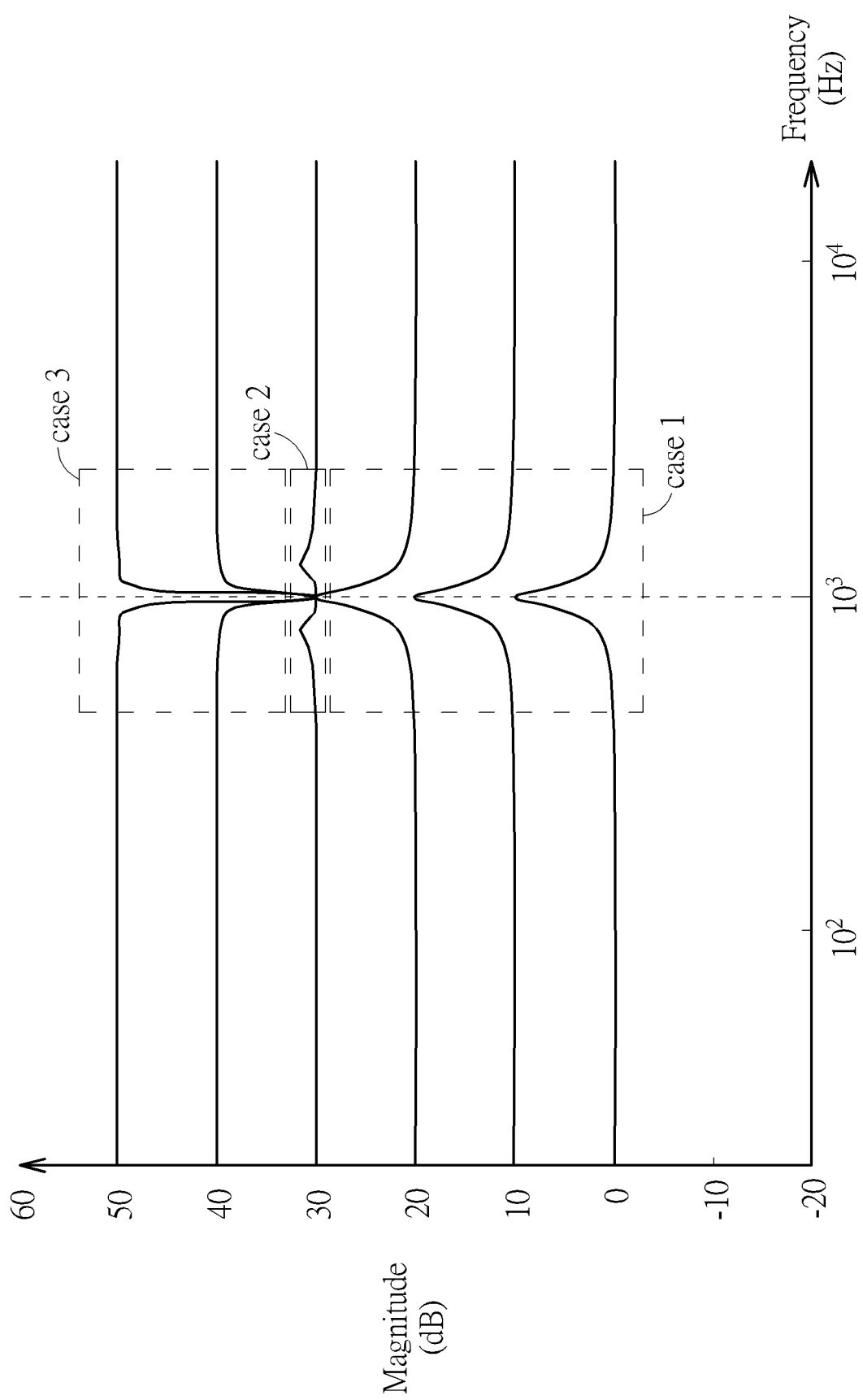
FIG. 6 is a diagram illustrating a frequency response obtained by the parametric equalizer shown in FIG. 2 according to an embodiment of the present invention.

FIG. 6 is a diagram illustrating a frequency response obtained by the parametric equalizer 200 shown in FIG. 2 according to an embodiment of the present invention. As shown in FIG. 6, it is assumed that a center frequency of the parametric equalizer 200 and the equalizer circuit 22 is $10^3$ hertz (Hz), the first threshold value TH1 is 30 dB, and the input level of the input signal A_IN is 0 dB to 50 dB, wherein 0 dB to 20 dB is the above-mentioned case 1, 30 dB is the above-mentioned case 2, and 40 dB to 50 dB is the above-mentioned case 3.

In case 1, since both of the input level of the input signal A_IN and the peak level of the output signal EQ_OUT are smaller than or equal to the first threshold value TH1, the parametric equalizer 200 may just amplify the input signal A_IN at the center frequency $10^3$ Hz, and no need to protect the peak level of the first protection signal PROTECT_1 from exceeding the first threshold value TH1 employed by the AGC circuit 28.

In case 2, since the input level of the input signal A_IN is smaller than or equal to the first threshold value TH1, and the peak level of the output signal EQ_OUT is greater than the first threshold value TH1, the parametric equalizer 200 may protect the peak level of the first protection signal PROTECT_1 from exceeding the first threshold value TH1 employed by the AGC circuit 28. As a result, the peak level of the first protection signal PROTECT_1 is limited at the first threshold value TH1 (e.g. the peak level of the first protection signal PROTECT_1 is limited at 30 dB), and the peak level of the equalizer output signal PEQ_OUT is equal to the peak level of the first protection signal PROTECT_1 (i.e. the peak level of the equalizer output signal PEQ_OUT is equal to 30 dB).

In case 3, since both of the input level of the input signal A_IN and the peak level of the output signal EQ_OUT are greater than the first threshold value TH1, the parametric equalizer 200 may protect the peak level of the first protection signal PROTECT_1 from exceeding the first threshold value TH1 employed by the AGC circuit 28. As a result, a peak level of the first protection signal PROTECT_1 is limited at the first threshold value TH1 (e.g. the peak level of the first protection signal PROTECT_1 is limited at 30 dB). Since the input level of the input signal A_IN is higher than the peak level of the first protection signal PROTECT_1, the equalizer output signal PEQ_OUT (PEQ_OUT=PROTECT_1+PROTECT_2) has a valley level equal to the peak level of the first protection signal PROTECT_1 (e.g. the valley level of the equalizer output signal PEQ_OUT is equal to 30 dB).

Figure 7:
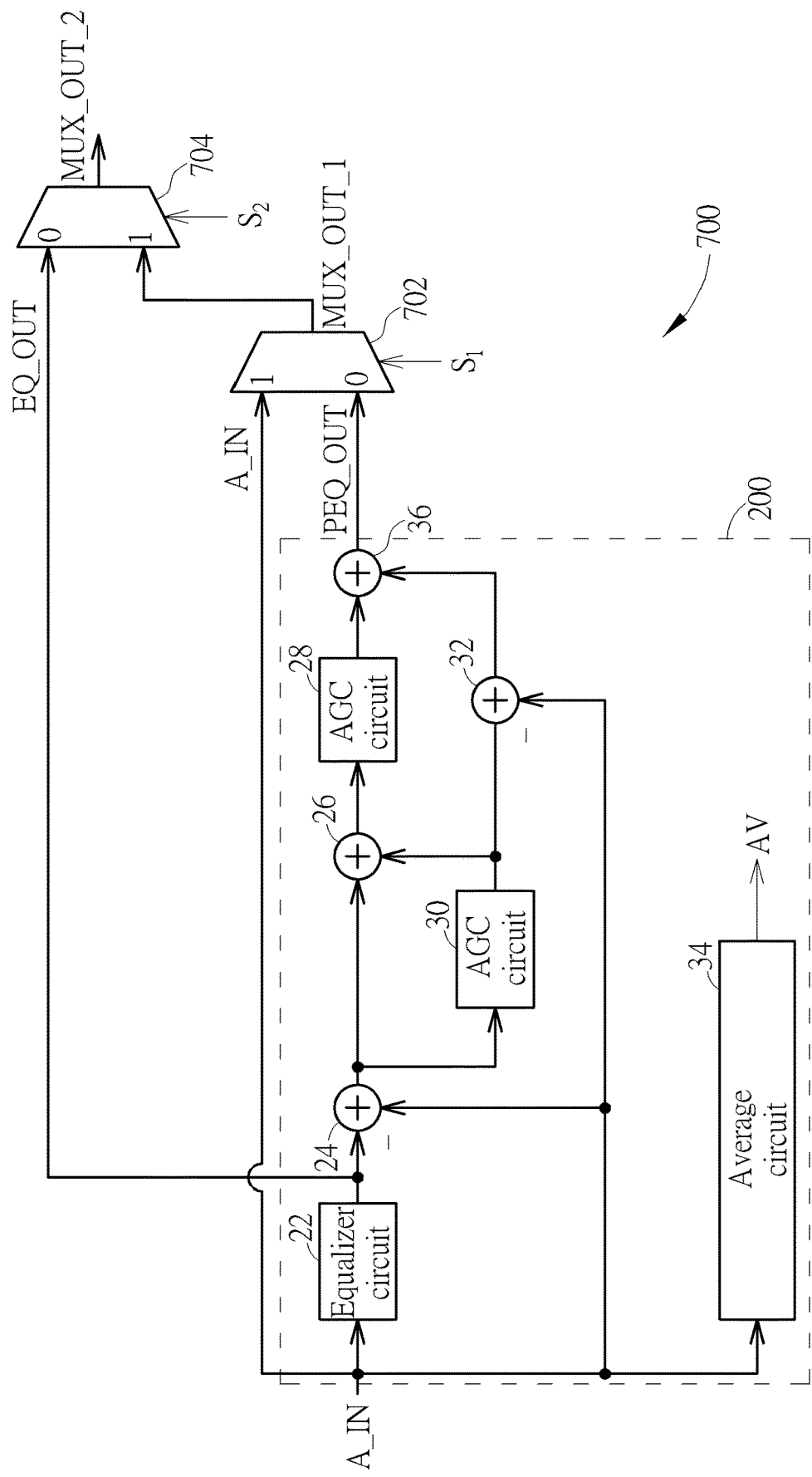
FIG. 7 is a diagram illustrating a parametric equalizer according to another embodiment of the present invention.

To perform several operation modes of parametric equalizer of the present invention, two 2-to-1 multiplexers (MUXs) may be coupled to the parametric equalizer 200. FIG. 7 is a diagram illustrating a parametric equalizer 700 according to another embodiment of the present invention. The parametric equalizer 700 may include the parametric equalizer 200 and a plurality of MUXs 702 and 704, and may support three operation modes: pure PEQ mode, APEQ only mode, and APEQ limit mode.

As shown in FIG. 7, the MUX 702 may have a first input port (labeled as "1" in FIG. 7), a second input port (labeled as "0" in FIG. 7), and a first output port, wherein the first input port may be arranged to receive the input signal A_IN, the second input port may be coupled to the addition circuit 36 of the parametric equalizer 200, and may be arranged to receive the equalizer output signal PEQ_OUT, and the MUX 702 may be arranged to couple the first output port to one of the first input port and the second input port according to a first selection signal $S_1$, to generate a first MUX output signal MUX_OUT_1.

When the parametric equalizer 700 needs to be operated as APEQ only mode and the input level of the input signal A_IN of the parametric equalizer 200 is greater than the first threshold value TH1, the first selection signal $S_1$ may be set by one logic level (e.g., $S_1$="1") indicating that the MUX 702 should couple the first output port to the first input port (i.e. the first MUX output signal MUX_OUT_1 is equal to the input signal A_IN). When the parametric equalizer 700 needs to be operated as APEQ limit mode or the input level of the input signal A_IN of the parametric equalizer 200 is smaller than or equal to the first threshold value TH1, the first selection signal $S_1$ may be set by another logic level (e.g., $S_1$="0") indicating that the MUX 702 should couple the first output port to the second input port (i.e. the first MUX output signal MUX_OUT_1 is equal to the equalizer output signal PEQ_OUT).

As shown in FIG. 7, the MUX 704 may have a third input port (labeled as "0" in FIG. 7), a fourth input port (labeled as "1" in FIG. 7), and a second output port, wherein the third input port may be coupled to the equalizer circuit 22 of the parametric equalizer 200, and may be arranged to receive the output signal EQ_OUT, the fourth input port may be coupled to the first output port of the MUX 702, and may be arranged to receive the first MUX output signal MUX_OUT_1, and the MUX 704 may be arranged to couple the second output port to one of the third input port and the fourth input port according to a second selection signal $S_2$, to generate a second MUX output signal MUX_OUT_2.

When the parametric equalizer 700 needs to be operated as APEQ only mode or APEQ limit mode, the second selection signal $S_2$ may be set by one logic level (e.g., $S_2$="1") indicating that the MUX 704 should couple the second output port to the fourth input port (i.e. the second MUX output signal MUX_OUT_2 is equal to the first MUX output signal MUX_OUT_1). When the parametric equalizer 700 needs to be operated as pure PEQ mode, the second selection signal $S_2$ may be set by another logic level (e.g., $S_2$="0") indicating that the MUX 704 should couple the second output port to the third input port (i.e. the second MUX output signal MUX_OUT_2 is equal to the output signal EQ_OUT).

Figure 8:
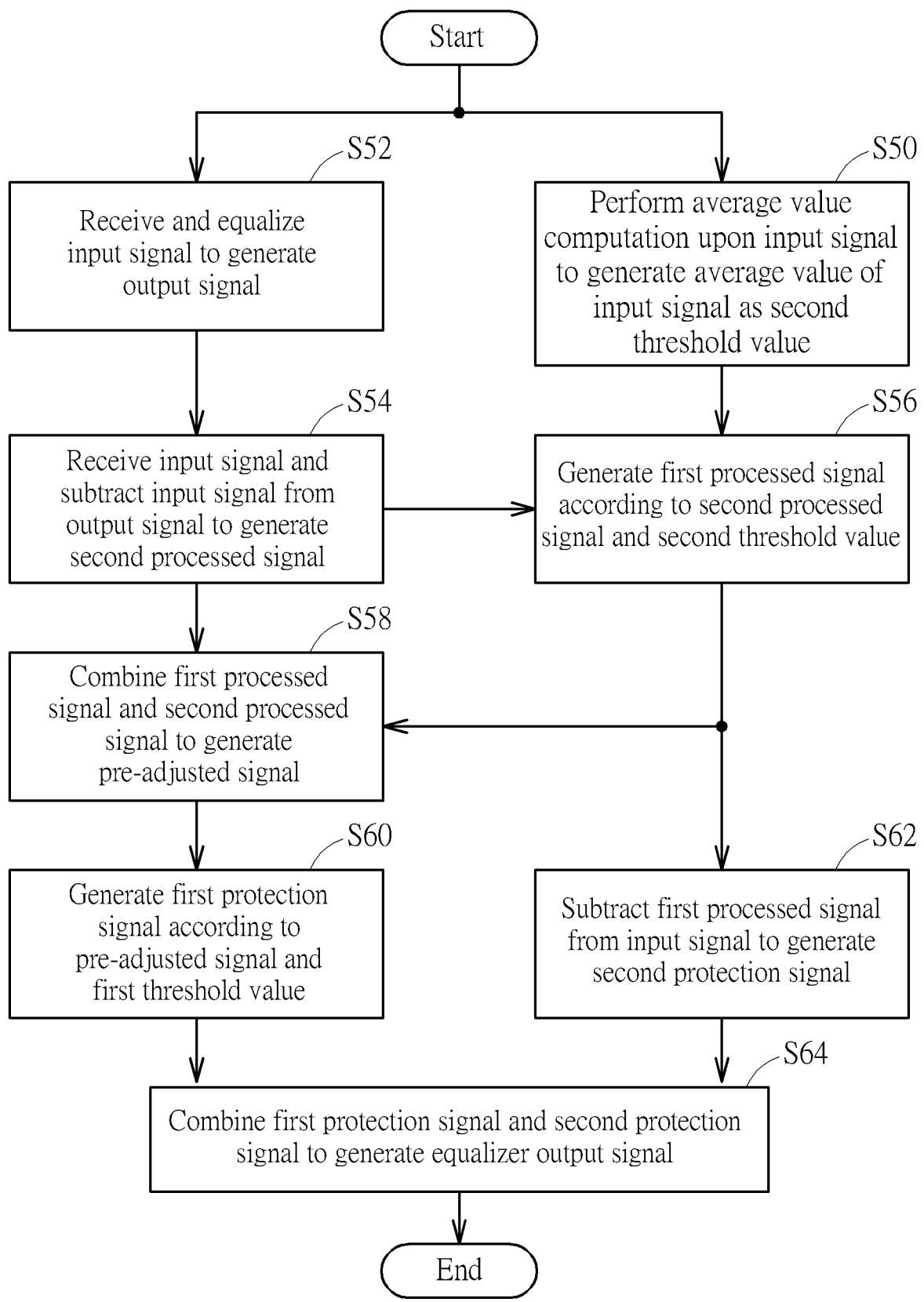
FIG. 8 is a flow chart illustrating a method for equalizing an input signal to generate an equalizer output signal according to an embodiment of the present invention.

FIG. 8 is a flow chart illustrating a method for equalizing an input signal A_IN to generate an equalizer output signal PEQ_OUT according to an embodiment of the present invention. Provided that the result is substantially the same, the steps are not required to be executed in the exact order shown in FIG. 8. For example, the method shown in FIG. 8 may be employed by the parametric equalizer 100/200.

In Step S50, the average value computation is performed upon the input signal A_IN to generate an average value AV of the input signal A_IN as a second threshold value TH2.

In Step S52, the input signal A_IN is received and equalized to generate an output signal EQ_OUT.

In Step S54, the input signal A_IN is received and subtracted from the output signal EQ_OUT to generate a second processed signal PROCESS_2.

In Step S56, a first processed signal PROCESS_1 is generated according to the second processed signal PROCESS_2 and the second threshold value TH2.

In Step S58, the first processed signal PROCESS_1 and the second processed signal PROCESS_2 are combined to generate a pre-adjusted signal PAD.

In Step S60, a first protection signal PROTECT_1 is generated according to the pre-adjusted signal PAD and a first threshold value TH1.

In Step S62, the first processed signal PROCESS_1 is subtracted from the input signal A_IN to generate a second protection signal PROTECT_2.

In Step S64, the first protection signal PROTECT_1 and the second protection signal PROTECT_2 are combined to generate the equalizer output signal PEQ_OUT.

Since a person skilled in the pertinent art can readily understand details of the steps after reading above paragraphs directed to the parametric equalizers 100 and 200, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A parametric equalizer, comprising:
   an equalizer circuit, arranged to receive an input signal, and process the input signal to generate an output signal;
   a first protection circuit, arranged to generate a first protection signal according to the output signal, the input signal, and a first processed signal, wherein a peak level of the first protection signal is protected from exceeding a first threshold value employed by the first protection circuit;
   a second protection circuit, arranged to generate a second protection signal according to the input signal and a second processed signal, wherein the first processed signal is involved in generation of the second protection signal, the second processed signal is involved in generation of the first protection signal, and a peak level of the first processed signal is protected from exceeding a second threshold value employed by the second protection circuit; and
   a first addition circuit, coupled to the first protection circuit and the second protection circuit, and arranged to combine the first protection signal and the second protection signal to generate an equalizer output signal.

2. The parametric equalizer of claim 1, wherein the first protection circuit comprises:
   a first subtraction circuit, coupled to the equalizer circuit, and arranged to receive the input signal, and subtract the input signal from the output signal to generate the second processed signal;
   a second addition circuit, coupled to the first subtraction circuit and the second protection circuit, and arranged to combine the first processed signal and the second processed signal to generate a pre-adjusted signal; and
   a first automatic gain control circuit, coupled to the second addition circuit, and arranged to generate the first protection signal according to the pre-adjusted signal and the first threshold value.

3. The parametric equalizer of claim 2, wherein the second protection circuit comprises:
   a second automatic gain control circuit, coupled to the first subtraction circuit and the second addition circuit, and arranged to generate the first processed signal according to the second processed signal and the second threshold value; and
   a second subtraction circuit, coupled to the second automatic gain control circuit, and arranged to subtract the first processed signal from the input signal to generate the second protection signal.

4. The parametric equalizer of claim 1, further comprising:
   an average circuit, arranged to generate an average value of the input signal as the second threshold value.

5. The parametric equalizer of claim 4, wherein the average value is a root-mean-square value of the input signal.

6. The parametric equalizer of claim 1, wherein both of an input level of the input signal and a peak level of the output signal are smaller than or equal to the first threshold value, and the equalizer output signal is identical to the output signal.

7. The parametric equalizer of claim 1, wherein an input level of the input signal is smaller than or equal to the first threshold value, a peak level of the output signal is greater than the first threshold value, a peak level of the equalizer output signal is limited at the first threshold value, and a minimum level of the equalizer output signal is equal to the input level of the input signal.

8. The parametric equalizer of claim 1, wherein both of an input level of the input signal and a peak level of the output signal are greater than the first threshold value, a valley value of the equalizer output signal is limited at the first threshold value, and a maximum level of the equalizer output signal is equal to the input level of the input signal.

9. The parametric equalizer of claim 1, further comprising:
   a first multiplexer circuit, having a first input port, a second input port, and a first output port, wherein the first input port is arranged to receive the input signal, the second input port is arranged to receive the equalizer output signal, and the first multiplexer circuit is arranged to couple the first output port to one of the first input port and the second input port according to a first selection signal; and
   a second multiplexer circuit, having a third input port, a fourth input port, and a second output port, wherein the third input port is arranged to receive the output signal, the fourth input port is arranged to receive an output at the first output port of the first multiplexer circuit, and the second multiplexer circuit is arranged to couple the second output port to one of the third input port and the fourth input port according to a second selection signal.

10. A method for equalizing an input signal to generate an equalizer output signal, comprising:
    receiving the input signal, and processing the input signal to generate an output signal;
    generating a first protection signal according to the output signal, the input signal, and a first processed signal, wherein a peak level of the first protection signal is protected from exceeding a first threshold value;
    generating a second protection signal according to the input signal and a second processed signal, wherein the first processed signal is involved in generation of the second protection signal, the second processed signal is involved in generation of the first protection signal, and a peak level of the first processed signal is protected from exceeding a second threshold value; and
    combining the first protection signal and the second protection signal to generate the equalizer output signal.

11. The method of claim 10, wherein generating the first protection signal according to the output signal, the input signal, and the first processed signal comprises:
    subtracting the input signal from the output signal to generate the second processed signal;
    combining the first processed signal and the second processed signal to generate a pre-adjusted signal; and
    generating the first protection signal according to the pre-adjusted signal and the first threshold value.

12. The method of claim 11, wherein generating the second protection signal according to the input signal and the second processed signal comprises:
    generating the first processed signal according to the second processed signal and the second threshold value; and
    subtracting the first processed signal from the input signal to generate the second protection signal.

13. The method of claim 10, further comprising:
    performing average value computation upon the input signal to generate an average value of the input signal as the second threshold value.

14. The method of claim 13, wherein the average value is a root-mean-square value of the input signal.

15. The method of claim 10, wherein both of an input level of the input signal and a peak level of the output signal are smaller than or equal to the first threshold value, and the equalizer output signal is identical to the output signal.

16. The method of claim 10, wherein an input level of the input signal is smaller than or equal to the first threshold value, a peak level of the output signal is greater than the first threshold value, a peak level of the equalizer output signal is limited at the first threshold value, and a minimum level of the equalizer output signal is equal to the input level of the input signal.

17. The method of claim 10, wherein both of an input level of the input signal and a peak level of the output signal are greater than the first threshold value, a valley value of the equalizer output signal is limited at the first threshold value, and a maximum level of the equalizer output signal is equal to the input level of the input signal.

18. The method of claim 10, further comprising:
    generating a first multiplexing output by performing a first multiplexing operation upon the input signal and the equalizer output signal according to a first selection signal; and
    generating a second multiplexing output by performing a second multiplexing operation upon the output signal and the first multiplexing output according to a second selection signal.

\* \* \* \* \*